United States Patent [19]

Peregrino et al.

[11] 4,135,243
[45] Jan. 16, 1979

[54] SINGLE SAMPLER HETERODYNE METHOD FOR WIDEBAND FREQUENCY MEASUREMENT

[75] Inventors: Luiz Peregrino; Darwin H. Throne, both of Cupertino, Calif.

[73] Assignee: Hewlett-Packard Company, Palo Alto, Calif.

[21] Appl. No.: 816,041

[22] Filed: Jul. 15, 1977

[51] Int. Cl.² ............................................. G01R 23/14
[52] U.S. Cl. ............................... 364/484; 235/92 FQ; 324/79 D; 328/134
[58] Field of Search ................ 364/484, 571, 604, 728, 364/819; 324/78 R, 79 R, 79 D, 82; 328/133, 134; 307/233 R; 235/92 FQ

[56] References Cited

U.S. PATENT DOCUMENTS

| | | | |
|---|---|---|---|
| 2,896,162 | 7/1959 | Berger et al. | 364/484 |
| 3,403,338 | 9/1968 | Martin | 324/79 D |
| 3,750,014 | 7/1973 | Gaw, Jr. | 324/79 D |
| 3,838,338 | 9/1974 | Khoury | 324/79 D |
| 3,984,770 | 10/1976 | Chu | 364/484 |
| 3,991,365 | 11/1976 | Takeuchi | 324/78 R |

OTHER PUBLICATIONS

Boff, "Frequency Meter Uses Digital Counters", *Electronics,* Jun. 1954, pp. 189–191.

*Primary Examiner*—Charles E. Atkinson
*Assistant Examiner*—Errol A. Krass
*Attorney, Agent, or Firm*—David A. Boone

[57] ABSTRACT

An input signal of unknown frequency is applied to a sampler which is driven by a sampling signal of frequency $f_O$ to produce an intermediate signal of frequency $f_{IF}$. The sampling frequency $f_O$ varies in response to a randomly, or pseudo-randomly varying signal which in turn causes the signal of frequency $f_{IF}$ to also vary. $f_{IF}$ will vary in the same way as $f_O$, but with a scale factor of $\pm N$, where N is the harmonic number. Correlation techniques are used to determine the harmonic number and the sideband to enable calculation of the input frequency. Errors in the determination of the harmonic number and sideband due to frequency modulation of the input signal are reduced, due to the variation imposed on the sampling frequency $f_O$.

7 Claims, 2 Drawing Figures

SINGLE SAMPLER HETERODYNE METHOD FOR WIDEBAND FREQUENCY MEASUREMENT

BACKGROUND AND SUMMARY

Some previous frequency measurement apparatus have utilized a single sampler. See, for example, U.S. Pat. No. 3,984,770 issued on Oct. 5, 1976 to David C. Chu and entitled "Frequency Measurement Using Phase Continuous Frequencies Switching". These single sampler systems are much to be desired over the prior art dual sampler systems such as that shown in U.S. Pat. No. 3,836,758 issued on Sept. 17, 1974 to Richard F. Schneider and Arthur R. Bloedorn and entitled "Wide Frequency Range Counter System Utilizing Automatic Range Searching and Loop Compensation". This is because significant cost savings can be achieved by eliminating one of the samplers required.

However, previous single sampler systems have typically utilized techniques wherein the single sampler is alternately driven by signals of two different preselected frequencies. The disadvantage of this technique is that changes in the input signal frequency due to frequency modulation or drift between the time the input signal is sampled using the signal of the first frequency and the time that the input signal is sampled using the signal of the second frequency may result in errors in the calculation of the harmonic number and sideband of the input frequency.

In accordance with the preferred embodiment of the present invention, a signal of unknown frequency is input into a sampler. The sampler is driven by a sampling signal which is caused to vary in an irregular or random manner by a control signal. The IF output of the sampler is gated to a counter using synchronous detection by the control signal. The correlation of the modulation applied to the sampling signal with the resultant frequency modulation of the IF signal cancels out frequency modulation of the input signal which may be present. Using the IF frequency value from the counter, one can compute N and the sidebands, since the IF frequency will vary in the same way as the sampling frequency, except for a scale factor which is equal to the harmonic number. If the frequency of the input signal is also varying, the effect of this variation on the measurement accuracy will be greatly diminished by the correlation process.

DESCRIPTION OF THE PREFERRED EMBODIMENT

Figure 1:
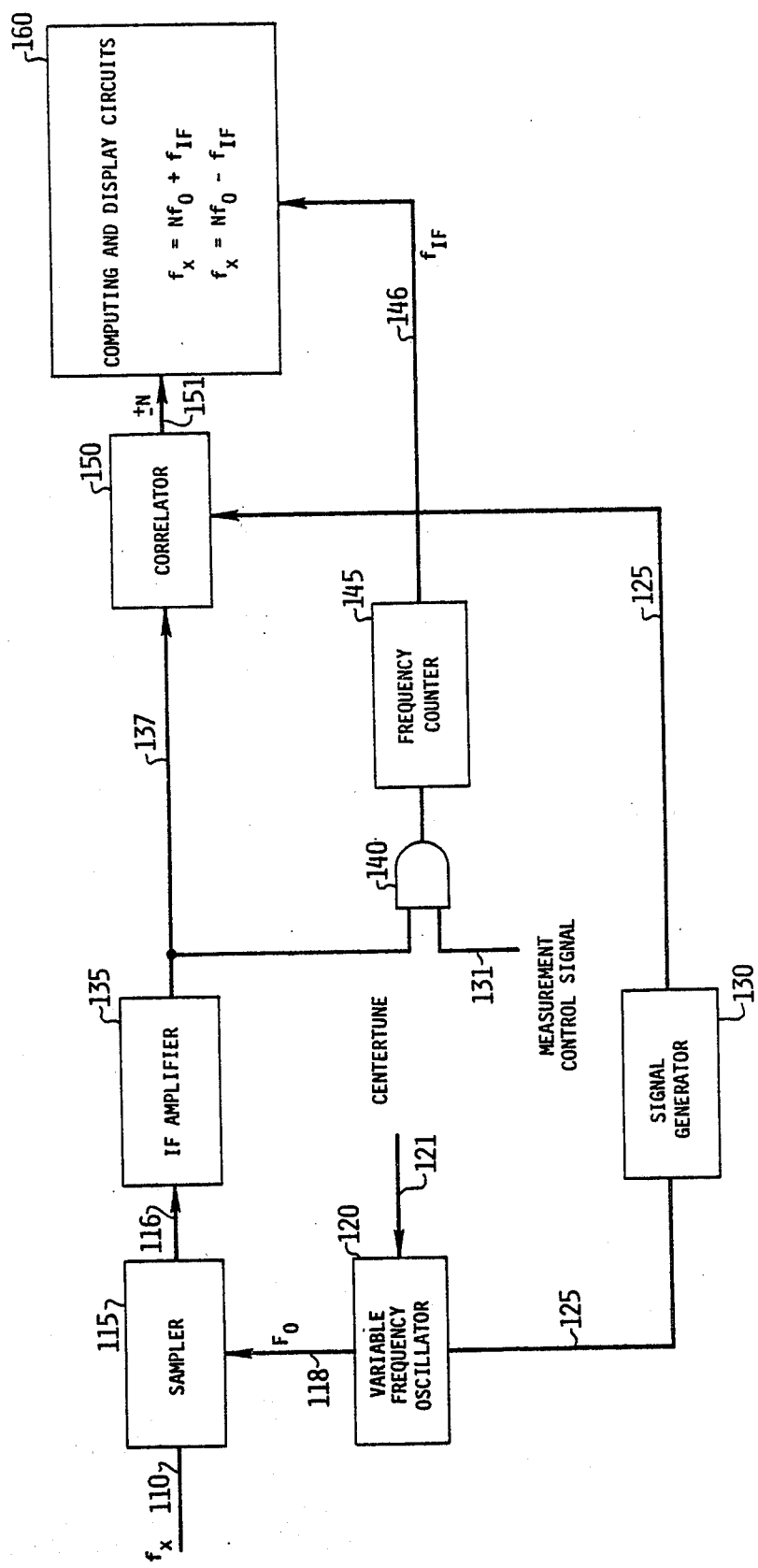
FIG. 1 shows a basic block diagram of a single sampler system driven by a deterministic or random signal for use in frequency measurement.

Referring now to FIG. 1, there is shown a block diagram of a single sampler system for frequency measurement. An input signal of unknown frequency is input on a line 110 to a sampler (or harmonic mixer) 115. The sampling (or mixing) signal on line 118 is provided by a variable frequency oscillator 120. The frequency of the signal on line 118 varies in a random manner in response to the signal on line 125, which is provided by signal generator 130. Signal generator 130 may provide a deterministic or a truly random signal on line 125 or simply one that varies in a pseudo-random or irregular manner.

The frequency of the signal on line 116, of frequency $f_{IF}$, will vary in response to the signal on line 118. However, the IF frequency variation will be related by a scale factor equal to the harmonic number, i.e., $\pm N$. This relationship is explained below;

If we let $f_0 = \bar{f}_0 + \Delta f_0(t)$ and $f_x = \bar{f}_x + \Delta f_x(t)$ where $\bar{f}_0$ is the average local oscillator frequency of the signal on line 118; $\bar{f}_x$ is the average frequency of the input signal; $\Delta f_0(t)$ is the applied random variation in response to the random or deterministic signal on line 125; and $\Delta f_x(t)$ is the variation if any in the frequency of the input signal. Then we have for the upper and lower sideband cases:

$$f_{IF} = \bar{f}_{IF} + \Delta f_{IF}(t) = \bar{f}_x + \Delta f_x(t) - N\bar{f}_0 - N\Delta f_0(t) \quad 1(a)$$

$$f_{IF} = \bar{f}_{IF} + \Delta f_{IF}(t) = N\bar{f}_0 + N\Delta f_0(t) - \bar{f}_x - \Delta f_x(t) \quad 1(b)$$

$$\Delta f_{IF}(t) = -N\Delta f_0(t) + \Delta f_x(t) \quad 2(a)$$

$$\Delta f_{IF}(t) = N\Delta f_0(t) - \Delta f_x(t) \quad 2(b)$$

By computing the cross correlation between the applied frequency variation $\Delta f_0(t)$ with the resultant $\Delta f_{IF}(t)$, we have $$C = -N \cdot \text{Corr}(\Delta f_0(t), \Delta f_0(t)) + \text{Corr}(\Delta f_0(t), \Delta f_x(t)) \quad 3(a)$$

$$C = +N \cdot \text{Corr}(\Delta f_0(t), \Delta f_0(t)) - \text{Corr}(\Delta f_0(t), \Delta f_x(t)) \quad 3(b)$$

If we make $\Delta f_0(t)$ independent or uncorrelated with $\Delta f_x(t)$, then the last term of C can be made negligible, and hence can be disregarded. This can be done by using a random variation of the frequency $f_0$.

Defining $R = \text{Corr}(\Delta f_0(t), \Delta f_0(t))$ and with the last term eliminated, we can evaluate N as:

$$N = \text{ROUND}(|C|/R)$$

(ROUND means round to nearest integer of the exact value computed.)

The fact that N is an integer number has been used to cancel any errors in the determination of the harmonic number N. Furthermore, the sign of N indicates which sideband is present.

Referring again to FIG. 1, there is shown the block diagram of the preferred embodiment. Sampler 115 provides the signal on a line 116 in response to the input signal on line 110 and the sampling signal on line 118. IF amplifier 135 amplifies and filters the signal to produce the IF frequency signal on line 137.

The tuning control signal on the line 121 is adjusted so that the IF amplifier output signal on line 137 is approximately in the center of the IF amplifier frequency band when an input signal is present on line 110. When an input signal is being sampled, signal generator 130 provides a random or pseudo-random control signal on line 125 which causes variable frequency oscillator 120 to vary the sampling signal on line 118 in a random or pseudo-random manner. Also, gate 140 is enabled by the control signal on 131 and the IF frequency of the signal on line 137 is measured by a counter 145. Furthermore, the random or pseudo-random signal on line 125 from signal generator 130 is used to drive a correlator 150 to correlate the IF amplifier output on line 137 with the signal on line 125. Since the IF frequency on line 137 varies in the same manner as the signal on line 118, except for a scale factor, ± N, one can determine both the harmonic number and the sideband present from the signal on the line 151, as described more fully above. Computing and display circuits 160 may then compute $f_x$ from the harmonic number and sideband information from the signal on line 151 and the measured IF frequency from counter 145. This is possible using the formula:

$$f_x = Nf_0 + f_{IF}$$

$$f_x = Nf_0 - f_{IF}$$

Figure 2:
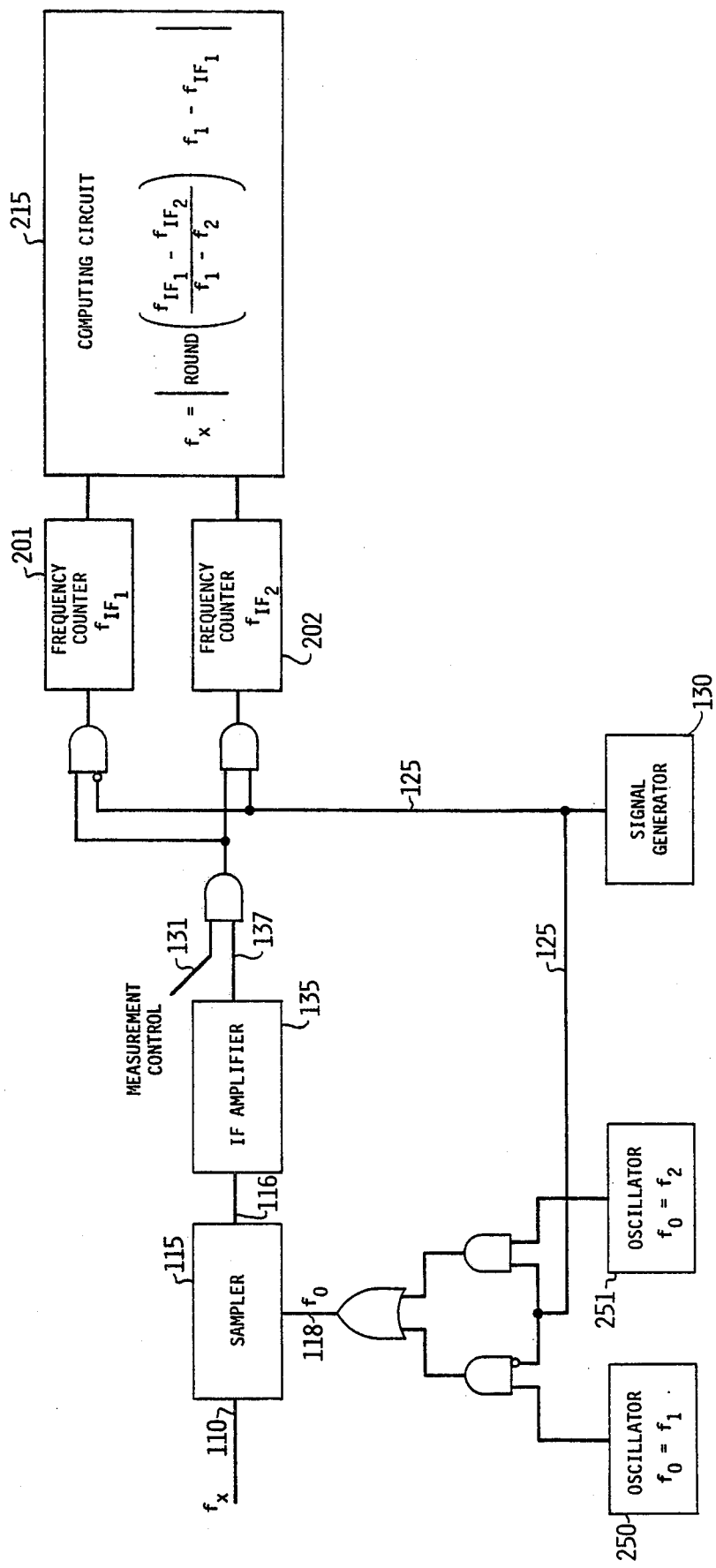
FIG. 2 is a block diagram of a single sampler system using two frequency counters and two distinct driving frequencies.

In FIG. 2 there is shown a variation of the basic circuitry shown in FIG. 1. The circuit of FIG. 2 uses two frequency counters to replace correlator 150. Instead of the signal on line 118 varying randomly over a range of frequencies, it is switched between two distinct frequencies, $f_1$ and $f_2$ in a random or pseudo-random manner. The IF frequency on line 137 is then synchronously detected and measured by frequency counters 201 and 202. As in the system of FIG. 1, a measurement control signal on line 131 enables the counting of the IF frequency. Knowing $f_1$ and $f_2$ and $f_{IF1}$ from counter 201 and $f_{IF2}$ from counter 202, one may now calculate $f_x$ per the following formula:

$$f_x = \left| \left[ \text{ROUND} \frac{(f_{IF1} - f_{IF2})}{f_1 - f_2} \right] f_1 - f_{IF1} \right|$$

For greater accuracy, an additional measurement may be made. Because the IF frequencies are being chopped between the times that frequency counter 201 and frequency counter 202 are enabled, there will be a count error of ± one count each time the counters are switched. This error may be cumulative and will not necessarily cancel out in every case. Therefore, after $f_{IF1}$ and $f_{IF2}$ have been determined using frequency counters 201 and 202, one may disable the random control signal on line 125 and cause $f_1$ to be gated to line 118 for a predetermined period. During this time, one can enable either counter 201 or 202 to count the IF frequency $f_{IF0}$. Using this method, a more accurate IF frequency would be obtained, since there would be no possibility of cumulative ± one count errors and the frequency $f_x$ would be calculated as follows:

$$f_x = \left| \left[ \text{ROUND} \frac{(f_{IF1} - f_{IF2})}{f_1 - f_2} \right] f_1 - f_{IF0} \right|$$

Note that the result of the division of $(f_{IF1}-f_{IF2})$ by $(f_1-f_2)$ is the harmonic number with a small error which is primarily caused by modulation present in the input signal on line 110 which is not cancelled out using the technique of the present invention. However, this residual error will not interfere with the accuracy of the measurement, unless it is quite large, since the harmonic number is always an integer. Therefore, the calculated value is simply rounded to the nearest integer, and the small error which may be present is of no effect in the determination of $f_x$.

We claim:

1. A method for use in determining the frequency of an input signal, the method comprising the steps of:
   receiving an input signal of an unknown frequency;
   providing a control signal;
   providing a sampling signal, said sampling signal varying in frequency in response to said control signal;
   sampling said input signal and providing an intermediate frequency signal in response to said sampling signal; and
   correlating the intermediate frequency signal with said control signal and providing in response thereto an indication of the harmonic number and the sideband which corresponds to the relationship of the unknown frequency of said input signal to the frequency of said sampling signal and to the frequency of said intermediate frequency signal.

2. The method as in claim 1 and further including the step of determining the frequency of said intermediate frequency signal.

3. The method as in claim 1 wherein the step of providing a control signal comprises the step of providing a digital control signal which varies between a first and a second state.

4. The method as in claim 3 wherein said step of providing a sampling signal comprises the steps of alternately providing a first sampling signal of a first sampling frequency in response to said first state of said digital control signal and providing a second sampling signal of a second sampling frequency in response to said second state of said digital control signal.

5. The method as in claim 4 and further comprising the steps of determining the intermediate frequency, $f_{IF1}$, produced by sampling the signal of unknown frequency, $f_x$, with said first sampling signal of said first sampling frequency $f_1$; and
   determining the intermediate frequency, $f_{IF2}$, produced by sampling the signal of unknown frequency with said second sampling signal of said sampling frequency, $f_2$.

6. The method as in claim 5 and further comprising the step of computing a value for said unknown frequency in accordance with the formula:

$$f_x = \left| \left[ \text{ROUND} \frac{(f_{IF1} - f_{IF2})}{f_1 - f_2} \right] f_1 - f_{IF1} \right|$$

where ROUND indicates that the number which results from the division of $(f_{IF1}-f_{IF2})$ by $(f_1-f_2)$ is to be rounded to the nearest integer.

7. The method as in claim 5 and further comprising the steps of:
   determining an intermediate frequency, $f_{IF0}$, by sampling the signal of unknown frequency with the sampling signal of frequency $f_1$ while temporarily suspending during the determination of $f_{IF0}$ the step of alternately providing the first sampling signal and then the second sampling signal in response to said digital control signal; and
   computing said unknown frequency in accordance with the formula:

$$f_x = \left| \left[ \text{ROUND} \frac{(f_{IF1} - f_{IF2})}{f_1 - f_2} \right] f_1 - f_{IF0} \right|$$

where ROUND indicates that the number which results from the division of $(f_{IF1}-f_{IF2})$ by $(f_1-f_2)$ is to be rounded to the nearest integer.

UNITED STATES PATENT AND TRADEMARK OFFICE
CERTIFICATE OF CORRECTION

PATENT NO. : 4,135,243
DATED : January 16, 1979
INVENTOR(S) : Luiz Peregrino and Darwin H. Throne It is certified that error appears in the above—identified patent and that said Letters Patent are hereby corrected as shown below:

Column 2, line 21, change "$f_x$" to -- $\bar{f}_x$ --.

Signed and Sealed this

Sixth Day of November 1979

[SEAL]

Attest:

RUTH C. MASON
*Attesting Officer*

LUTRELLE F. PARKER
*Acting Commissioner of Patents and Trademarks*